(12) United States Patent
Choi et al.

(10) Patent No.: US 8,330,049 B2
(45) Date of Patent: Dec. 11, 2012

(54) CIRCUIT BOARD MODULE AND METHOD OF MANUFACTURING THE SAME

(75) Inventors: Yoon Hyuck Choi, Gyunggi-do (KR); Dae Hyeong Lee, Seoul (KR); Jin Waun Kim, Gyunggi-do (KR); Kwang Jae Oh, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 565 days.

(21) Appl. No.: 12/550,812

(22) Filed: Aug. 31, 2009

(65) Prior Publication Data
US 2010/0252305 A1    Oct. 7, 2010

(30) Foreign Application Priority Data
Apr. 1, 2009    (KR) .................. 10-2009-0028009

(51) Int. Cl.
*H05K 1/00*    (2006.01)
(52) U.S. Cl. ........................................ 174/252
(58) Field of Classification Search .................. 174/252
See application file for complete search history.

(56) References Cited

U.S. PATENT DOCUMENTS

| | | | | |
|---|---|---|---|---|
| 3,909,680 A | * | 9/1975 | Tsunashima | 361/748 |
| 2001/0026211 A1 | | 10/2001 | Shindoh et al. | |
| 2006/0120058 A1 | * | 6/2006 | Fairchild et al. | 361/761 |

FOREIGN PATENT DOCUMENTS

| | | |
|---|---|---|
| JP | 05-114665 | 5/1993 |
| JP | 6-066004 U | 9/1994 |
| JP | 2001-345205 | 12/2001 |

OTHER PUBLICATIONS

Korean Office Action, with English Translation, issued in Korean Patent Application No. 10-2009-0028009, dated Oct. 22, 2010.

* cited by examiner

*Primary Examiner* — Chau Nguyen
*Assistant Examiner* — Theron Milliser
(74) *Attorney, Agent, or Firm* — McDermott Will & Emery LLP

(57) ABSTRACT

There is provided a circuit board module and a method of manufacturing the same. The circuit board module may include: a circuit board; a resistor arranged on the circuit board; pads covering both edges of the resistor; adhesive portions provided at least on the pads and formed of an electrically insulating material; and a heat dissipation member provided on the resistor and bonded to the pads using the adhesive portions.

The adhesive portions are selectively formed, thereby preventing short circuits occurring between the resistor mounted onto the circuit board and the heat dissipation member. Accordingly, the reliability of components can be increased. Furthermore, an adhesive material used to connect the board and the heat dissipation member is formed of a thermally conductive material, thereby increasing heat dissipation efficiency.

16 Claims, 6 Drawing Sheets

CIRCUIT BOARD MODULE AND METHOD OF MANUFACTURING THE SAME

CROSS-REFERENCE TO RELATED APPLICATIONS

This application claims the priority of Korean Patent Application No. 2009-0028009 filed on Apr. 1, 2009, in the Korean Intellectual Property Office, the disclosure of which is incorporated herein by reference.

BACKGROUND OF THE INVENTION

1. Field of the Invention

The present invention relates to a circuit board module and a method of manufacturing the same, and more particularly, to a circuit board module that has high component reliability and heat dissipation efficiency and a method of manufacturing the same.

2. Description of the Related Art

Recently, as the trend towards the miniaturization of electronic components has been reinforced and has persisted, small modules and boards are under development by the high precision forming of electronic components into micropatterns and thin films.

Among devices that are mounted on these small modules and boards, resistors may be printed on the surface of a board and then fired.

A separate insulating layer is applied over the entire surface of the resistors and the entire surface of the board. Resistor exposing portions are then formed by performing laser machining on the resistors.

Here, the insulating layer is not applied over portions of resistor pads where resistors are not mounted. A process of connecting probe tips to the pads onto which the resistors are mounted and trimming the resistors, while forming resistor exposing portions on resistor bodies until a desired resistance is obtained, is required to obtain a desired resistance. Therefore, the resistor pads and the portions of the resistors subjected to the trimming process are exposed to the atmosphere.

Then, an adhesive is coated randomly over the board, and the board having the resistors mounted thereon and a heat dissipation plate are bonded using the adhesive.

In the above-described process, a short circuit occurs frequently between the conductive heat sink and the resistor exposing portions or the exposed pads that are partially exposed.

SUMMARY OF THE INVENTION

An aspect of the present invention provides a circuit board module that has high component reliability and heat dissipation efficiency and a method of manufacturing the same.

According to an aspect of the present invention, there is provided a circuit board module including: a circuit board; a resistor arranged on the circuit board; pads covering both edges of the resistor; adhesive portions provided at least on the pads and formed of an electrically insulating material; and a heat dissipation member provided on the resistor and bonded to the pads using the adhesive portions.

The circuit board module may further include an insulating layer provided on an entire area of the circuit board except for the pads.

The insulating layer may be provided on an upper surface of the resistor.

The insulating layer may include a resistor exposing portion through which the resistor is exposed.

The adhesive portions may be formed of a thermally conductive material.

The circuit board may be a low temperature co-fired ceramic (LTCC) board.

The heat dissipation member may be formed of aluminum.

According to another aspect of the present invention, there is provided a method of manufacturing a circuit board module, the method including: arranging a resistor on a circuit board; forming pads to cover both edges of the resistor; forming adhesive portions using an electrically insulating material at least on the pads; and bonding a heat dissipation member to the pads using the adhesive portions.

The method may further include: disposing a first mask having openings therein through which an area of the circuit board is exposed except for the pads; and forming an insulating layer on the area of the circuit board, exposed through the openings, except for the pads.

The first mask may be formed of metal.

The insulating layer may be formed on an upper surface of the resistor.

The method may further include forming a resistor exposing portion in the insulating layer through which the resistor is exposed.

The resistor exposing portion may be formed using a laser to obtain a desired resistance.

The adhesive portions may be formed of a thermally conductive material.

The forming of the adhesive portions may include: disposing a second mask having openings therein through which at least the pads are exposed; and coating the pads, exposed through the openings, with an electrically insulating adhesive paste.

The adhesive portions may cover at least the resistor exposing portion.

The second mask may be formed of metal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
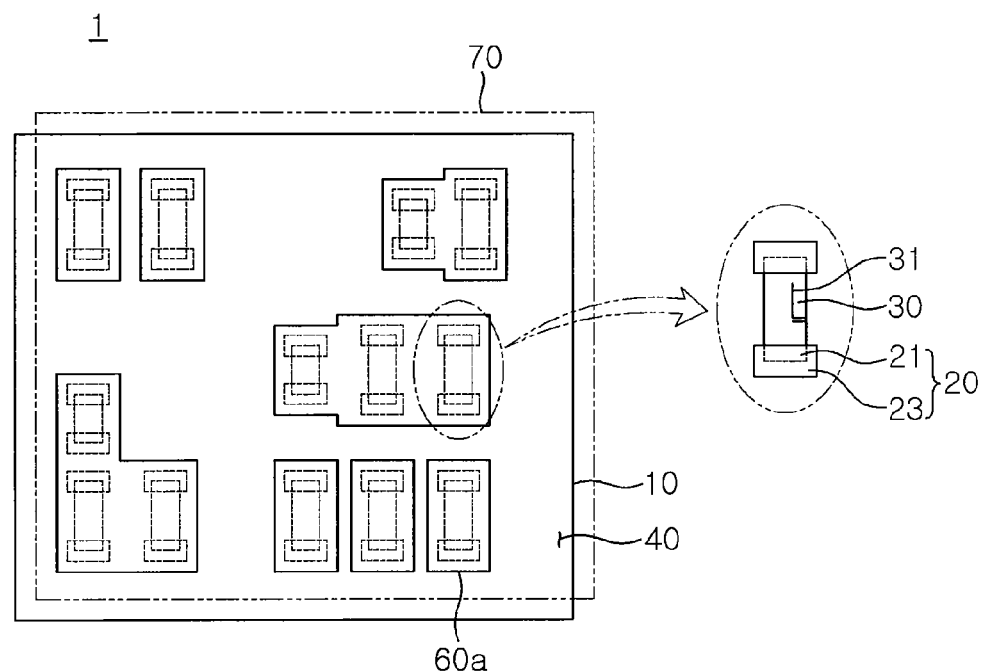
FIG. 1 is a schematic plan view illustrating a circuit board module according to an exemplary embodiment of the present invention.

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Hereinafter, a circuit board module 1 according to an exemplary embodiment of the invention will be described with reference to FIGS. 1 and 2.

Figure 2:
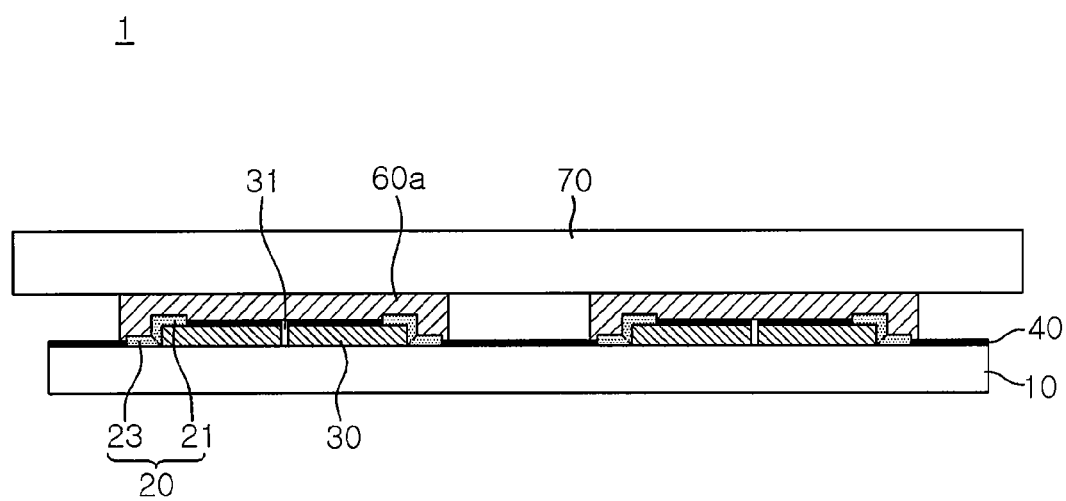
FIG. 2 is a cross-sectional view illustrating the circuit board module, shown in FIG. 1.

FIG. 1 is a schematic plan view illustrating a circuit board module 1 according to an exemplary embodiment of the invention. FIG. 2 is a cross-sectional view illustrating the circuit board module 1, shown in FIG. 1.

A circuit board module 1 according to this embodiment includes a circuit board 10, resistors 30, pads 20, adhesive portions 60a and a heat dissipation member 70. The resistors 30 are arranged on the circuit board 10. The pads 20 cover both edges of each of the resistors 30. The adhesive portions 60a are provided on the pads 20 and the resistors 30 and are formed of an electrically insulating material. The heat dissipation member 70 is provided on the resistors 30 and bonded to the pads 20 through the adhesive portions 60a.

The circuit board module 1 may further include an insulating layer 40 that is formed over the entire area of the circuit board 10 except for the pads 20. The insulating layer 40 may be formed on upper surfaces of the resistors 30.

Various kinds of components may be mounted on the circuit board 10. In this embodiment, a description will be made of a case in which a low temperature co-fired ceramic (LTCC) board is taken as an example of the circuit board 10.

The resistors 30 are arranged on the circuit board 10 and include resistor exposing portions 31 through which the resistors 30 are partially exposed. The resistor exposing portion 31 of each of the resistors 30 is formed by providing the insulating layer 40 over the resistors 30 and etching the insulating layer 40 using a laser or the like until a desired resistance is obtained.

The pads 20 are formed to cover both edges of each of the resistors 30. First region 23 of the pads 20 are formed on the circuit board 10, and second regions 21 thereof cover both edges of each resistor 30.

Each of the adhesive portions 60a, formed of an electrically insulating material, is selectively formed on the resistor 30 to cover the pads 20, and bonds the pads 20 and the heat dissipation member 70 to each other.

The heat dissipation member 70 is arranged above the resistors 30 and is bonded to the pads 20, formed on the circuit board 10 and the resistors 30, through the adhesive portions 60a. The heat dissipation member 70 is formed of aluminum and dissipates heat generated from various components including the resistors 30 mounted on the circuit board 10.

As described above, the adhesive portions 60a are selectively formed on the resistors 30 to cover the pads 20, thereby preventing short circuits that may occur frequently between the heat dissipation member 70 having conductivity and the pads 20 or the resistor exposing portions 31 of the resistors 30, which are exposed without being covered with the insulating layer 40 in the related art. Therefore, the reliability of components can be increased. Furthermore, heat dissipation efficiency can be increased by forming the adhesive portions 60a of a thermally conductive material.

Hereinafter, a circuit board module 2 according to another exemplary embodiment of the invention will be described with reference to FIGS. 3 and 4.

Figure 3:
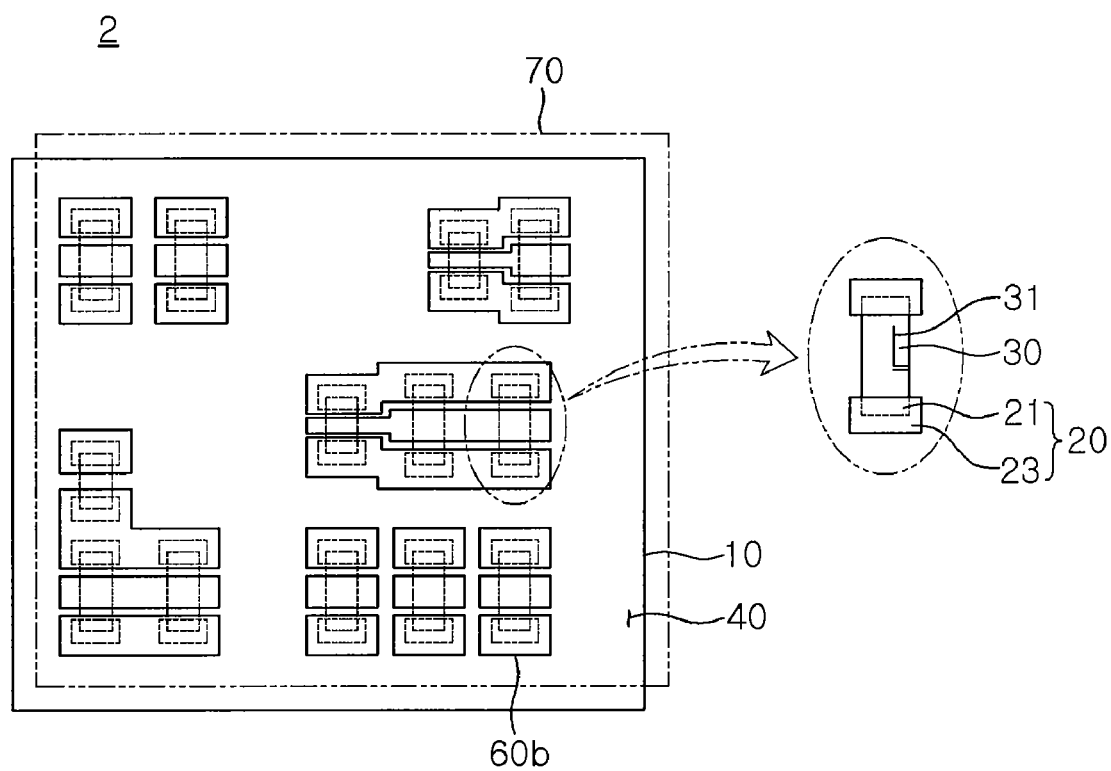
FIG. 3 is a schematic plan view illustrating a circuit board module according to another exemplary embodiment of the present invention.
Figure 4:
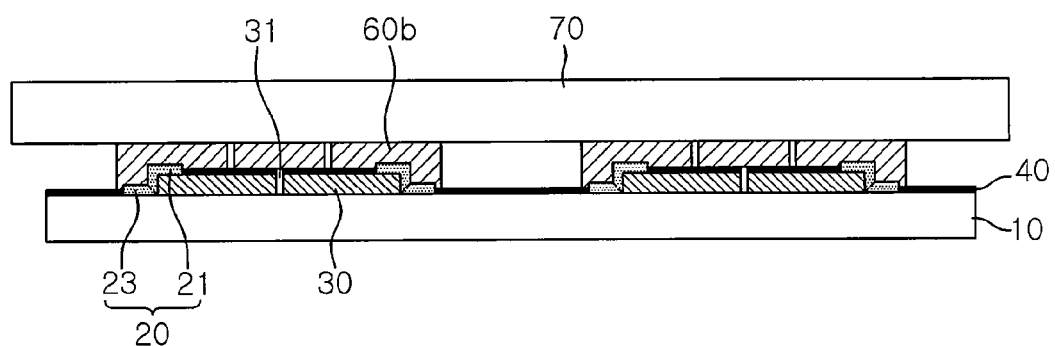
FIG. 4 is a cross-sectional view illustrating the circuit board module, shown in FIG. 3.

FIG. 3 is a schematic plan view illustrating a circuit board module 2 according to another embodiment of the invention. FIG. 4 is a cross-sectional view illustrating the circuit board module 2, shown in FIG. 3.

The circuit board module 2 according to this embodiment includes a circuit board 10, resistors 30, pads 20, adhesive portions 60b and a heat dissipation member 70. The resistors 30 are arranged on the circuit board 10. The pads 20 cover both edges of each of the resistors 30. The adhesive portions 60b are provided on the pads 20 and portions of the resistors 30 and are formed of an electrically insulating material. The heat dissipation member 70 is arranged above the resistors 30 and bonded to the pads 20 through the adhesive portions 60b.

The circuit board module 2 may further include an insulating layer 40 that is provided on the entire area of the circuit board 10 except for the pads 20. Further, the insulating layer 40 may be formed on the upper surfaces of the resistors 30.

Various components may be mounted on the circuit board 10. In this embodiment, a description will be made of a case in which a low temperature co-fired ceramic (LTCC) is taken as an example of the circuit board 10.

The resistors 30 are arranged on the circuit board 10 and include resistor exposing portions 31 through which the resistors 30 are partially exposed. The resistor exposing portions 31 of the resistors 30 are formed by providing the insulating layer 40 on the resistors 30 and then etching the insulating layer 40 using a laser or the like until a desired resistance is obtained.

The pads 20 are formed to cover both edges of each of the resistors 30. First regions 23 of pads 20 are arranged on the circuit board 10, and second regions 21 thereof are formed to cover both edges of each of the resistors 30.

The adhesive portions 60b, formed of an electrically insulating material, are selectively formed on the resistors 30 to cover the pads 20. The adhesive portions 60b according to this embodiment are selectively formed on the resistor exposing portions 31 of the resistors 30. Like the adhesive portions 60a according to the embodiment, shown in FIG. 1, the adhesive portions 60b according to this embodiment are used to bond the pads 20 and the heat dissipation member 70 to each other.

The heat dissipation member 70 is arranged above the resistors 30 and bonded to the pads 20, formed on the circuit board 10 and the resistors 30, through the adhesive portions 60b. The heat dissipation member 70 is formed of aluminum and dissipates heat generated from various components including the resistors 30 mounted onto the circuit board 10.

As such, the adhesive portions 60b are selectively formed on the resistor exposing portion 31 of the resistors 30 so as to cover the pads 20, thereby preventing short circuits that may frequently occur between the pads 20, which are exposed without being covered with the insulating layer 40 in the related art, or the resistor exposing portions 31 of the resistors 30 and the heat dissipation member 70 having conductivity. Therefore, component reliability can be increased. Further, heat dissipation efficiency can be increased by forming the adhesive portions 60b of a thermally conductive material.

A method of manufacturing a circuit board module 3 according to an exemplary embodiment of the invention will be described with reference to FIGS. 5 and 10.

FIGS. 5 through 10 are schematic cross-sectional views illustrating a method of manufacturing a circuit board module 3 according to another exemplary embodiment of the invention.

Figure 5:
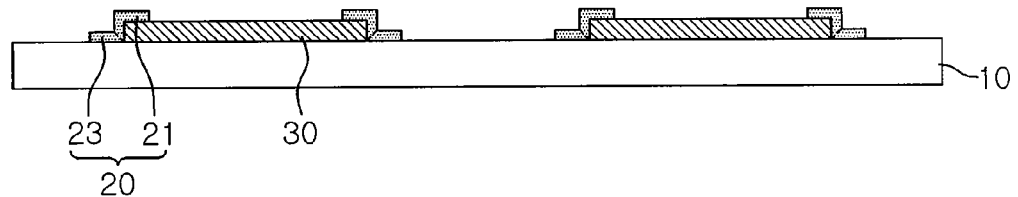
FIGS. 5 through 10 are schematic cross-sectional views illustrating a method of manufacturing a circuit board module according to another exemplary embodiment of the present invention.

Referring to FIG. 5, the resistors 30 are arranged on the circuit board 10, and then the pads 20 are formed to cover both edges of each of the resistors 30. The first regions 23 of the pads 20 are formed on the circuit board 10, and the second regions 21 thereof are formed to cover both edges of each of the resistors 30.

Figure 6:
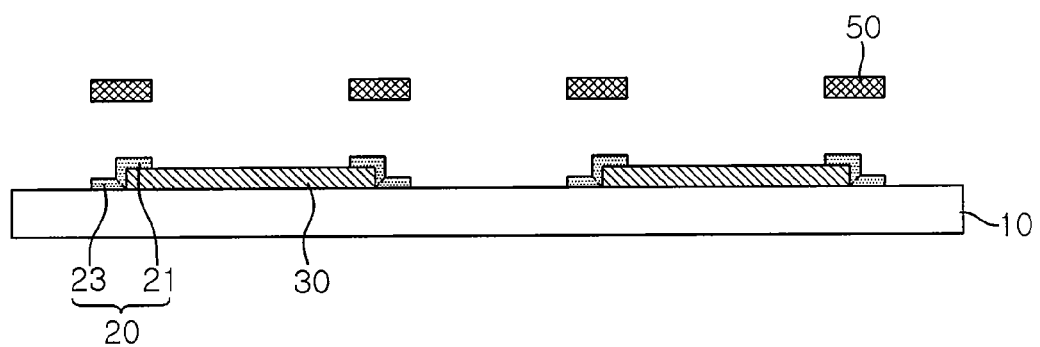

Then, as shown in FIG. 6, a first mask 50 is disposed on the circuit board 10, masking the pads 20. Here, the first mask 50 has openings therein, through which the circuit board 10 and the resistors 30 are partially exposed, except for the pads 20. The openings may have the same size as that of the insulating layer 40 to be formed later, as shown in FIG. 7, or may be slightly greater than the insulating layer 40 in considerations of process margins.

Figure 7:
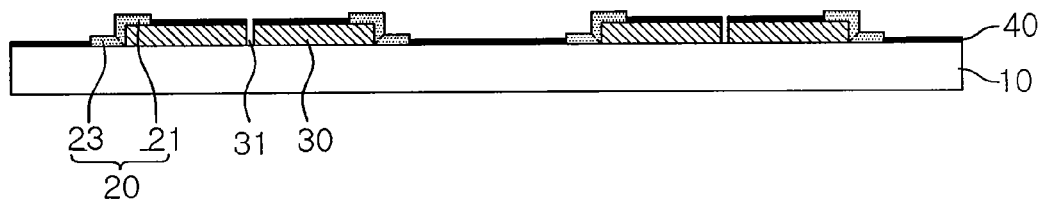

Then, as shown in FIG. 7, the circuit board 10 and the resistors 30, exposed through the openings of the first mask 50, are coated with an insulating material with the exception of the pads 20, thereby forming the insulating layer 40. After the insulating layer 40 is formed, resistor trimming is performed by connecting resistor trimming probes to both sides of the pads 20 and forming the resistor exposing portions 31 in the resistors 30 until a desired resistance is obtained. Here, resistor trimming may be etched using a general laser.

Figure 8:
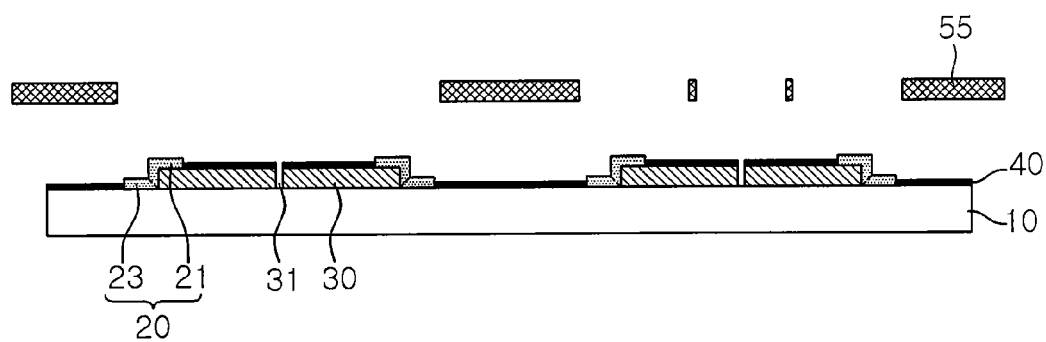

Further, as shown in FIG. 8, a second mask 55 is disposed on the circuit board 10 having the insulating layer 40 applied thereon. Here, the second mask 55 includes openings therein through which the resistors 30 and the pads 20 are exposed. The openings may be the same size as the adhesive portions 60a and 60b to be formed later, as shown in FIG. 9, or may be slightly greater than the adhesive portions 60a and 60b in consideration of process margins.

Figure 9:
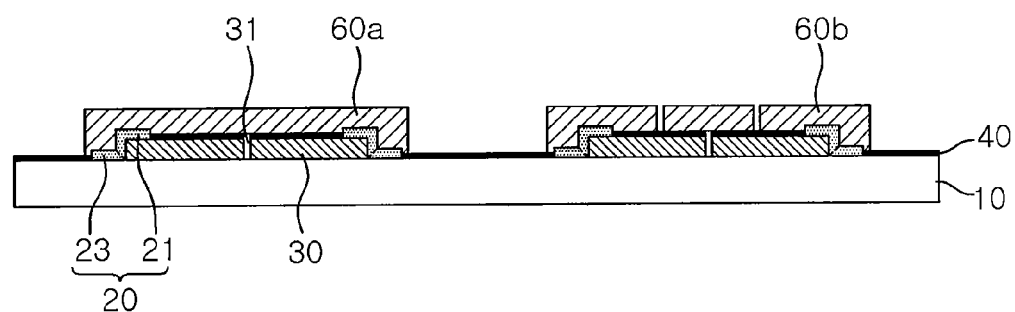

Then, as shown in FIG. 9, the resistors 30 and the pads 20 are coated with a thermally conductive adhesive material through the openings of the second mask 55, thereby forming the adhesive portions 60a and 60b. In this embodiment, the adhesive portions 60a completely covering the resistors 30 and the pads 20 according to the above-described embodiment, shown in FIG. 1, and the adhesive portions 60b selectively covering the pads 20 and the resistor exposing portions 31 of the resistors 30 according to the above-described embodiment, shown in FIG. 3, are all included. As such, the adhesive portions 60a and 60b may be formed if necessary.

Figure 10:
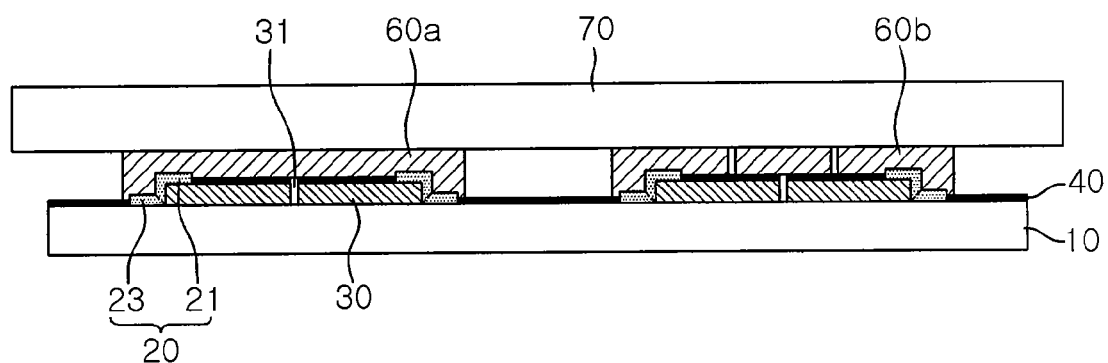

Finally, as shown in FIG. 10, the heat dissipation member 70 is arranged on the adhesive portions 60a and 60b, and the pads 20, mounted on the circuit board 10, and the heat dissipation member 70 are bonded using the adhesive portions 60a and 60b.

As described above, the adhesive portions 60a and 60b are selectively formed on the pads 20 and the resistors 30 or the pads 20 and the resistor exposing portions 31 of the resistors 30, thereby preventing short circuits that may occur frequently between the heat dissipation member 70 and the resistor exposing portions 31 or the pads 20 of the resistors 30 that are not covered with the insulating layer 40 in the related art. As a result, component reliability can be increased. Furthermore, the adhesive portions 60a and 60b are formed of a thermally conductive material, thereby increasing heat dissipation efficiency.

Accordingly, as compared with the related art, the reliability of components can be increased without causing an increase in costs, by selectively forming the adhesive portions 60a and 60b on the components in which a short circuit may frequently occur.

As set forth above, according to exemplary embodiments of the invention, by selectively forming adhesive portions on a circuit board module, a short circuit occurring between resistors mounted onto the circuit board and a heat dissipation member can be prevented to thereby increase the reliability of components.

Furthermore, an adhesive material used to connect the board and a heat dissipation device is formed of a thermally conductive material, thereby increasing heat dissipation efficiency.

While the present invention has been shown and described in connection with the exemplary embodiments, it will be apparent to those skilled in the art that modifications and variations can be made without departing from the spirit and scope of the invention as defined by the appended claims. In the exemplary embodiments, a pad may be formed on the entire bottom of one resistor or pads may be formed on portions of the bottom of one resistor.

What is claimed is:

1. A circuit board module, comprising:
   a circuit board;
   a resistor arranged on the circuit board;
   pads covering two end surfaces of the resistor;
   an adhesive portion disposed at least on the pads and formed of an electrically insulating material;
   an insulating layer disposed on an entire area of the circuit board except for on the pads covering the two end surfaces of the resistor; and
   a heat dissipation member disposed on the resistor and bonded to the pads with the adhesive portion.

2. The circuit board module of claim 1, wherein the insulating layer is disposed on an upper surface of the resistor.

3. The circuit board module of claim 1, wherein the insulating layer comprises a resistor exposing portion through which the resistor is exposed.

4. The circuit board module of claim 1, wherein the adhesive portion is formed of a thermally conductive material.

5. The circuit board module of claim 1, wherein the circuit board is a low temperature co-fired ceramic (LTCC) board.

6. The circuit board module of claim 1, wherein the heat dissipation member is formed of aluminum.

7. A method of manufacturing a circuit board module, the method comprising:
   arranging a resistor on a circuit board;
   forming pads to cover two end surfaces of the resistor;
   forming an adhesive portion using an electrically insulating material at least on the pads;
   forming an insulating layer on an entire area of the circuit board except for on the pads covering the two end surfaces of the resistor; and
   bonding a heat dissipation member to the pads using the adhesive portion.

8. The method of claim 7, wherein the forming the insulating layer includes:
   disposing a first mask having openings therein through which an area of the circuit board is exposed except for on the pads covering the two end surfaces of the resistor; and
   forming the insulating layer on the area of the circuit board, exposed through the openings, except for on the pads covering the two end surfaces of the resistor.

9. The method of claim 8, wherein the first mask is formed of metal.

10. The method of claim 8, wherein the insulating layer is formed on an upper surface of the resistor.

11. The method of claim 8, further comprising forming a resistor exposing portion in the insulating layer through which the resistor is exposed.

12. The method of claim 11, wherein the resistor exposing portion is formed using a laser to obtain a desired resistance.

13. The method of claim 7, wherein the adhesive portion is formed of a thermally conductive material.

14. The method of claim 7, wherein the forming of the adhesive portion comprises:
   disposing a second mask having particular openings therein through which at least the pads are exposed; and
   coating the pads, exposed through the particular openings, with an electrically insulating adhesive paste.

15. The method of claim 11, wherein the adhesive portion covers at least the resistor exposing portion.

16. The method of claim 14, wherein the second mask is formed of metal.

* * * * *